United States Patent
Inoue (10) Patent No.: US 7,378,900 B2
(45) Date of Patent: May 27, 2008

(54) EMI FILTER

(75) Inventor: Tomoki Inoue, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 11/537,842

(22) Filed: Oct. 2, 2006

(65) Prior Publication Data

US 2007/0096849 A1    May 3, 2007

(30) Foreign Application Priority Data

Oct. 5, 2005    (JP) ............................. 2005-292570

(51) Int. Cl.
*H03K 5/00* (2006.01)
*H03H 7/01* (2006.01)

(52) U.S. Cl. ...................... 327/551; 333/181

(58) Field of Classification Search ........ 327/515–559, 327/311; 333/181
See application file for complete search history.

(56) References Cited

U.S. PATENT DOCUMENTS 6,304,126 B1   10/2001 Berthiot
7,088,592 B2*   8/2006 Su et al. ............... 361/753

FOREIGN PATENT DOCUMENTS

| JP | 2005-167095 | 6/2005 |
| JP | 2005-167096 | 6/2005 |
| JP | 2005-228807 | 8/2005 |

OTHER PUBLICATIONS

"2-Line EMI-Filter with ESD-Protection", Technical document of Vishay Semiconductors product GTF701-HS3, Document No. 85827, Rev 1.3, Jul. 4, 2005, p. 1 and 3.
U.S. Appl. No. 11/537,842, filed Oct. 2, 2006, Inoue.
U.S. Appl. No. 11/563,848, filed Nov. 28, 2006, Inoue.
"2-Line EMI-Filter with ESD-Protection", Technical document of Vishay Semiconductors product GTF701-HS3, Document No. 85827, Rev. 1.3, Jul. 4, 2005, pp. 1and 3.

* cited by examiner

*Primary Examiner*—Dinh T. Le
(74) *Attorney, Agent, or Firm*—Oblon, Spivak, McClelland, Maier & Neustadt, P.C.

(57) ABSTRACT

EMI filter 20 includes input terminal Vin, output terminal Vout, resistor component R1 and diodes D1 and D2. Resistor component R1 is composed of polycrystalline resistor component Rp and ring resistor components R11 and R12. Polycrystalline resistor component Rp is connected between input and output terminals Vin and Vout. Ring resistor components R11 and R12 are provided on one and the other sides of polycrystalline resistor component at a prescribed distance, respectively. Further, diode D1 has cathode and anode electrodes connected to input terminal Vin and reference potential Vss, respectively. Likewise, diode D2 has cathode and anode electrodes connected to output terminal Vout and reference potential Vss, respectively. Ring resistor components R11 and R12 are rectangular in shape to electromagnetically couple to polycrystalline resistor component Rp. When a high frequency signal is applied to input terminal Vin, an electric current flowing through polycrystalline resistor component Rp generates magnetic fields so that ring resistor components R11 and R12 electro-magnetically induce an electric current.

17 Claims, 5 Drawing Sheets

EMI FILTER

CROSS-REFERENCE OF RELATED APPLICATIONS

This application is based upon and claims the benefit of priority from the prior Japanese Patent Application No. 2005-292570, filed on Oct. 5, 2005, the entire contents of which are incorporated herein by reference.

FIELD OF THE INVENTION

This invention generally relates to an electromagnetic interference (EMI) filter and, in particular, to an EMI filter with electrostatic discharge (ESD) protective diodes.

BACKGROUND OF THE INVENTION

EMI filters to suppress noise generated from electronic devices are more widely used in various applications as semiconductor integrated circuits are increased in integration and provided with high performance. In addition to suppressing noise, EMI filters enhanced with ESD protection have been recently developed for the ESD protection to prevent elements of the EMI filters from destruction due to external high-voltage surges. Various types of EMI filters are available for ordinary signal lines, high-speed signal lines and power lines: an RC type composed of resistor components and capacitors, an LC type composed of inductors and capacitors, an inductor type, a capacitor type, etc. Since Zener diodes have a highly protective capability for external high-voltage surges, such Zener diodes are applied for ESD protection. Capacitive components of ESD protective diodes are used for capacitors and filters composed of such capacitors and resistor components suppress noise at ordinary time when no ESD occurs, so that low-pass filters and the like have been developed (as disclosed in Vishay Inc., Data Sheet "CTF701-HS3 (2 Line EMI-Filter with ESD-Protection).

In the case of the RC type EMI filters or the like, however, where a resistor component that exhibits a small impedance in a low frequency band is used for the purpose of reduction of an insertion loss, a large current flows through the resistor component and ESD protective diodes at the occurrence of external high-voltage surges, so that required ESD endurance cannot be sustained. On the other hand, where a resistor component that exhibits a large impedance in a low frequency band is used, required ESD endurance can be sustained but a required insertion loss cannot be maintained.

SUMMARY OF THE INVENTION

According to an embodiment of the present invention, an EMI filter includes an input terminal to which a first input signal ranging from a DC to a prescribed frequency and a second input signal ranging in not less than the prescribed frequency are supplied, an output terminal, a main resistor component connected between the input terminal and the output terminal, a first coupling resistor component provided along the main resistor component at a prescribed distance to electro-magnetically induce an electric current when the main resistor component transmits the first input signal to the output terminal, and a first diode having cathode and anode electrodes connected to the input terminal and a reference potential, respectively.

According to an alternative embodiment of the present invention, an EMI filter includes input and output terminals, first and second main resistor components, first through fourth coupling resistor components, first and second diodes and a capacitor. The input terminal is supplied with a first input signal ranging from a DC to a prescribed frequency and a second input signal ranging in not less than the prescribed frequency. The first main resistor component is connected to the input terminal while a second main resistor component is serially connected to the first main resistor component with respect to the input and output terminals. The first and second coupling resistor components are provided on one and the other sides of the first main resistor component at a prescribed distance, respectively, to electro-magnetically induce an electric current when the first main resistor component transmits the first input signal to the output terminal. Likewise, since the third and forth coupling resistor components are provided on one and the other sides of the second main resistor component at a prescribed distance, respectively, to electro-magnetically couple with the second main resistor component, an electric current is induced in the third and fourth coupling resistor components when the second main resistor component transmits the first input signal to the output terminal. The first diode has cathode and anode electrodes connected to the input terminal and a reference potential, respectively. The second diode also has cathode and anode electrodes connected to the output terminal and the reference potential, respectively. Further, the capacitor is connected between a connecting node of the first and second main resistor components and the reference potential.

According to a further alternative embodiment of the present invention, an EMI filter includes input and output terminals, first and second main resistor components, first through fourth coupling resistor components and a diode. The input terminal is supplied with a first input signal ranging from a DC to a prescribed frequency and a second input signal ranging in not less than the prescribed frequency. The first main resistor component is connected to the input terminal while the second main resistor component is serially connected to the first main resistor component terminal with respect to the input and output terminals. The first and second coupling resistor components are provided on one and the other sides of the first main resistor component at a prescribed distance to electro-magnetically couple with the first resistor component. Thus, an electric current is induced in the first and second coupling resistor components when the first main resistor component transmits the first input signal to the output terminal. Likewise, since the third and fourth coupling resistor components are provided on one and the other sides of the second main resistor component at a prescribed distance to electro-magnetically couple with the second main resistor component, respectively, an electric current is induced in the third and fourth coupling resistor components when the second main resistor component transmits the first input signal to the output terminal. The diode is connected between a connecting node of the first and second main resistor components and the reference potential.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Embodiments of the present invention will be explained below with reference to the attached drawings. It should be noted that the present invention is not limited to the embodiments but also covers their equivalents. Throughout the attached drawings, similar or same reference numerals show similar, equivalent or same components. The drawings, however, are shown schematically for the purpose of explanation, so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

First Embodiment

Figure 1:
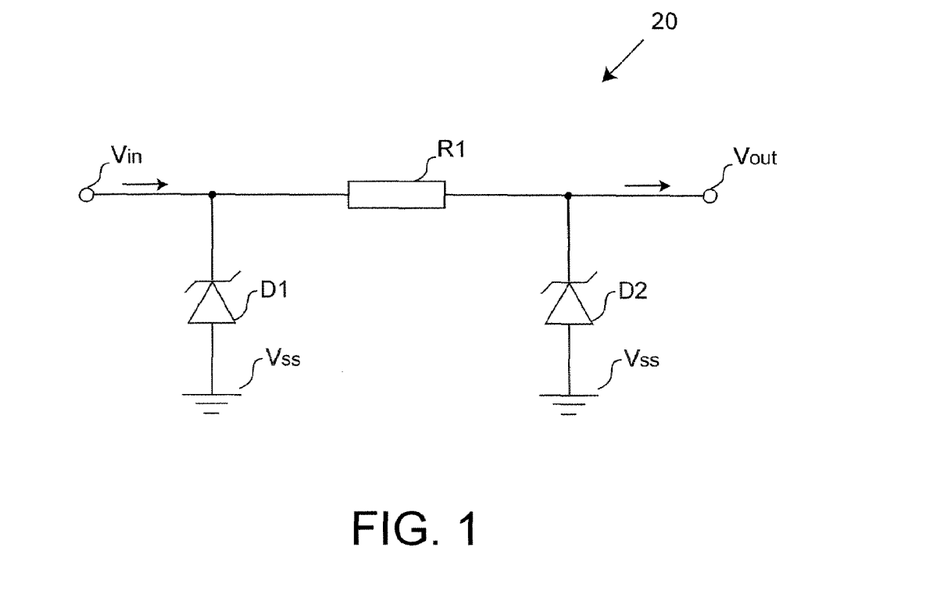
FIG. 1 is a circuit diagram of an EMI filter in accordance with the first embodiment of the present invention.
Figure 2:
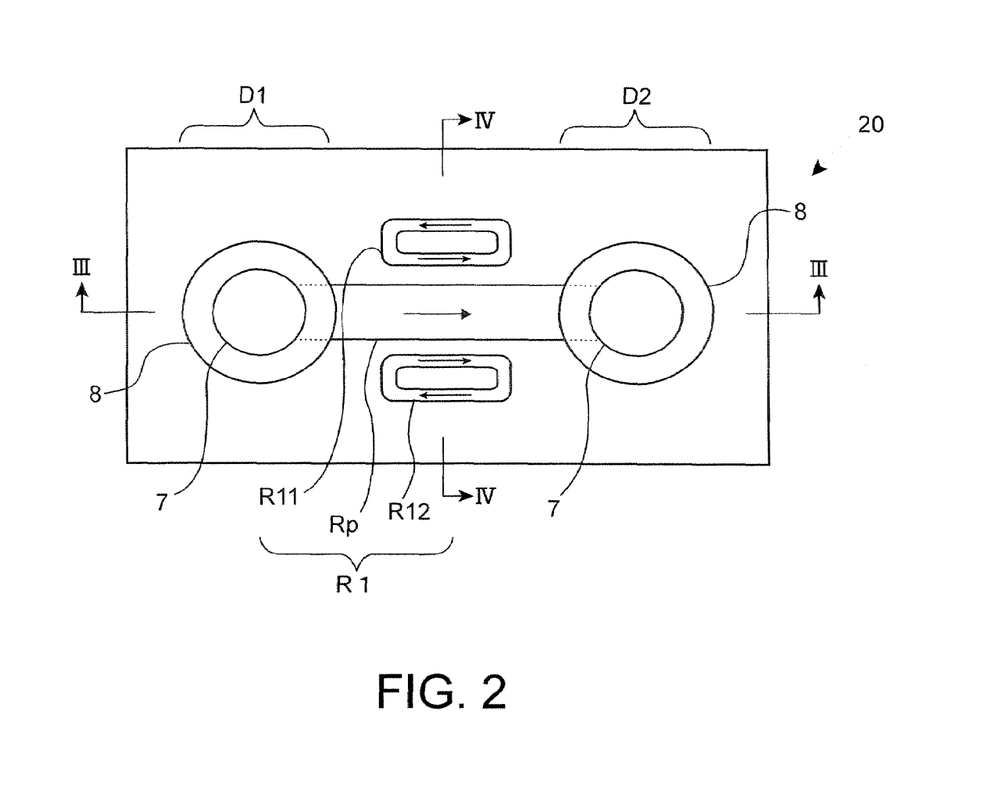
FIG. 2 is a schematic plan view of the EMI filter shown in FIG. 2.
Figure 3:
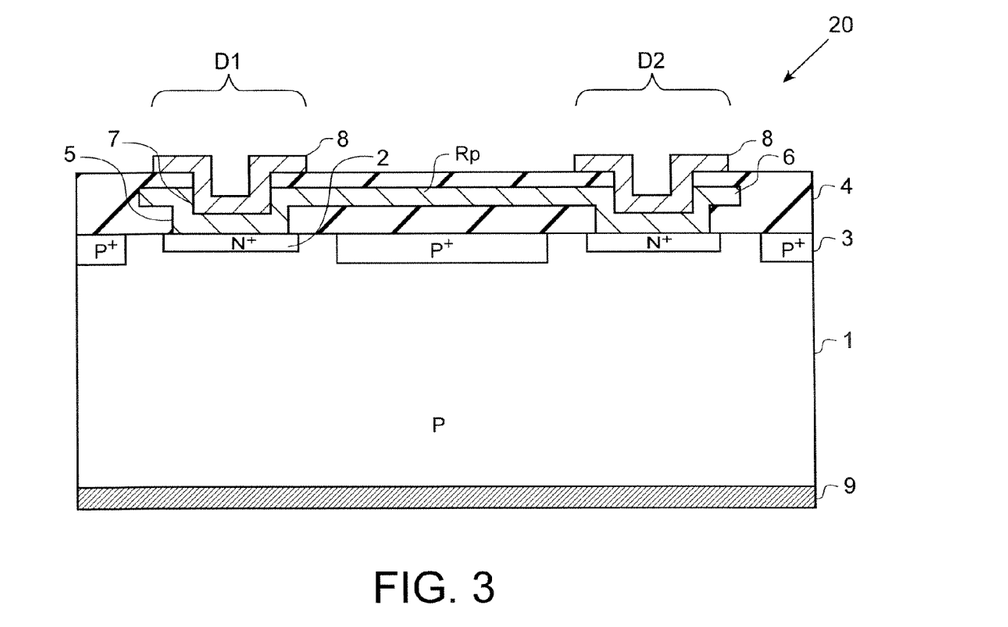
FIG. 3 is a sectional view of the EMI filter cut along line III-III of FIG. 2.
Figure 4:
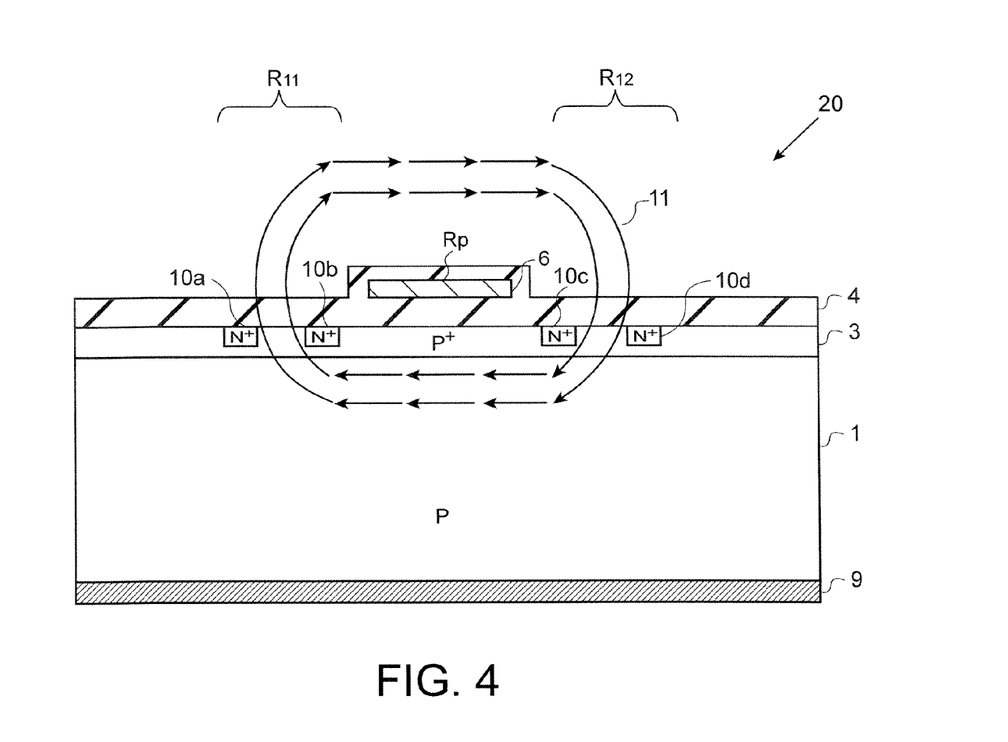
FIG. 4 is a schematic sectional view of the EMI filter cut along line IV-IV of FIG. 1.

An EMI Filter with ESD protective diodes in accordance with the first embodiment of the present invention will be explained with reference to the attached drawings. FIG. 1 is a circuit diagram of the EMI filter while FIG. 2 is its schematic plan view. FIGS. 3 and 4 are enlarged sectional views cut along lines III-III and IV-IV of the EMI filter shown in FIG. 2, respectively. In this embodiment, Zener diodes are used for the ESD protections.

As shown in FIG. 1, EMI filter 20 is provided with diodes D1 and D2 and resistor component R1. EMI filter 20 is an RC type low-pass filter (LPF). Input signals supplied at input terminal Vin pass through EMI filter 20 when the input signals are in a passing band (lower than a prescribed frequency) and are provided to output terminal Vout.

When input signals supplied at input terminal Vin, however, are in a cutting-off band (higher than a prescribed frequency), such input signals are not provided to output terminal Vout. Further, when an ESD takes place, a high voltage surge of an ESD pulse applied to input terminal Vin is significantly reduced through diodes D1 and D2 and the ESD pulse thus reduced in voltage is provided to output terminal Vout. As a result, devices and integrated circuits connected to output terminal Vout are prevented from electrostatic destruction or electrostatic deterioration. Here, an RC type LPF is well integrated with semiconductor integrated circuits in comparison with an LC type LPF composed of a coil inductance and a capacitor and an area occupied by the former can be less than that occupied by the latter.

Diode D1 is a Zener diode, the cathode and anode electrodes of which are connected to input terminal Vin and low voltage power source or reference potential Vss, respectively. A capacitive component of diode D1 functions as a capacitor when diode D1 works in its ordinary operation.

One terminal of resistor component R1 is connected to input terminal Vin and cathode electrode of diode D1 while the other terminal of resistor component R1 is connected to output terminal Vout and cathode electrode of diode D2. When a high frequency signal is applied to input terminal Vin, resistor component R1 can be regarded as a signal transmission line expressed as a circuit model composed of a resistor component (R), inductor (L) and capacitor (C). Resistor component R1 will be described in more detail later.

Diode D2 is also a Zener diode, the cathode and anode electrodes of which are connected to input terminal Vout and low voltage power source Vss, respectively. A capacitive component of diode D2 functions a capacitor when diode D2 works in its ordinary operation.

As shown in FIG. 2, EMI filter 20 is provided with diodes D1 and D2, polycrystalline silicon resistor component or main resistor component Rp, and coupling resistor components R11 and R12. Resistor components Rp and coupling resistor components R11 and R12 constitute resistor component R1 shown in FIG. 1.

Each of diodes D1 and D2 has circular contact opening 7 and cathode electrode 8. Contact opening 7 is provided in cathode electrode 8.

Polycrystalline silicon resistor component Rp is a stripe in shape. One terminal of polycrystalline silicon resistor component Rp is connected to cathode electrode 8 of diodes D1 while the other terminal of polycrystalline silicon resistor component Rp is connected to cathode electrode 8 of diodes D2. Polycrystalline silicon resistor component Rp functions as a resistor component that transmits a signal applied at input terminal Vin to output terminal Vout.

Each of coupling resistor components R11 and R12 forms a ring or a rectangular loop disposed at a prescribed distance along either side of polycrystalline silicon resistor component Rp. Coupling resistor components R11 and R12 are electro-magnetically coupled with polycrystalline silicon resistor component Rp as will be set forth below. Further, coupling resistor components R11 and R12 or their equivalent components are called ring resistor components below.

When a signal is applied to input terminal Vin, a current directing to output terminal Vout flows through polycrystalline silicon resistor component Rp. In the case that the signal is a high frequency, a magnetic field is generated around polycrystalline silicon resistor component Rp and electro-magnetically induces electric currents in ring resistor components R11 and R12. The magnetic fields will be described in more detail later.

The induced electric currents in ring resistor components R11 and R12 become larger in value as respective gaps defined between polycrystalline silicon resistor component Rp and its opposite portions of ring resistor components R11 and R12 become narrower. Also, values of electric currents flowing through polycrystalline silicon resistor component Rp depend on lengths of ring resistor components R11 and R12 measured along polycrystalline silicon resistor component Rp. The currents are more suppressed, for example, as the lengths of ring resistor components R11 and R12 are longer. Further, no currents of ring resistor components R11 and R12 are substantially induced when signals of polycrystalline silicon resistor component Rp range from a low frequency to a DC component.

The currents flowing through polycrystalline silicon resistor component Rp decrease in the case of a high frequency band in comparison with a low frequency band containing a DC component. In other words, impedances of polycrystalline silicon resistor component Rp are higher in values at a high frequency than at a low frequency.

As shown in FIG. 3, EMI filter 20 includes N+ anode layers 2 and P+ inverse prevention layers 3 selectively formed in a surface (first main surface) of P type semiconductor substrate 1. N+ anode layers 2 and P+ inverse prevention layers 3 are provided separately at a prescribed distance. P+ inverse prevention layers 3 prevents the surface of P type semiconductor substrate 1 from being inversed to an N type when reverse direction voltages are applied to diodes D1 and D2.

N+ anode layers 2 and P+ inverse prevention layers 3 are covered with insulating layer 4, openings 5 of which are made to expose portions of N+ anode layers 2. Such exposed portions on N+ anode layers 2, insulating layer 4 around the exposed portions and insulating layers 4 on N+ anode layers 2 of diodes D1 and D2 are covered with N+ polycrystalline silicon layers 6 as polycrystalline silicon resistor components.

Here, a high temperature diffusion method is applied to form N+ anode layers 2 through N+ polycrystalline silicon layers 6 but, alternatively, an ion implantation process and a high temperature treatment process is also applied. In the latter case, a surface density of N+ anode layer 2 can be set separately from an N type impurity density of N+ polycrystalline silicon layers 6.

Insulating layers 4 covering N+ polycrystalline silicon layers 6 are provided with contact openings 7 to expose portions of N+ polycrystalline silicon layers 6. Cathode electrodes 8 of diodes D1 and D2 are formed on the exposed portions of N+ polycrystalline silicon layers 6.

Anode electrode 9 is formed on the back surface (second main surface) of P type semiconductor substrate 1. Here, although anode electrode 9 is directly formed on P type silicon substrate 1, a P+ layer may be provided between anode electrode 9 and P type semiconductor substrate 1.

As shown in FIG. 4, EMI filter 20 is provided with N+ layers 10a, 10b, 10c and 10d selectively formed on a surface (first main surface) of P+ inverse prevention layer 3. N+ layers 10a, 10b, 10c and 10d constitute ring resistor components R11 and R12. When a high frequency signal is supplied to input terminal Vin (FIG. 1), a current flowing through polycrystalline silicon resistor component Rp to output terminal Vout (FIG. 1) is generated so that magnetic fields 11 are generated around polycrystalline silicon resistor component Rp. The electromagnetic coupling induces electric currents flowing through ring resistor components R11 and R12.

Characteristics of the EMI filter with the ESD diodes will be explained with reference to FIG. 5, which shows relationships between amplitudes and frequencies. Solid line (a) and dotted line (b) indicate characteristics of the embodiments according to the present invention and those of a prior art EMI filter, respectively. The prior art EMI filter, however, does not contain any ring resistor components connected to both end terminals of a resistor component.

Figure 5:
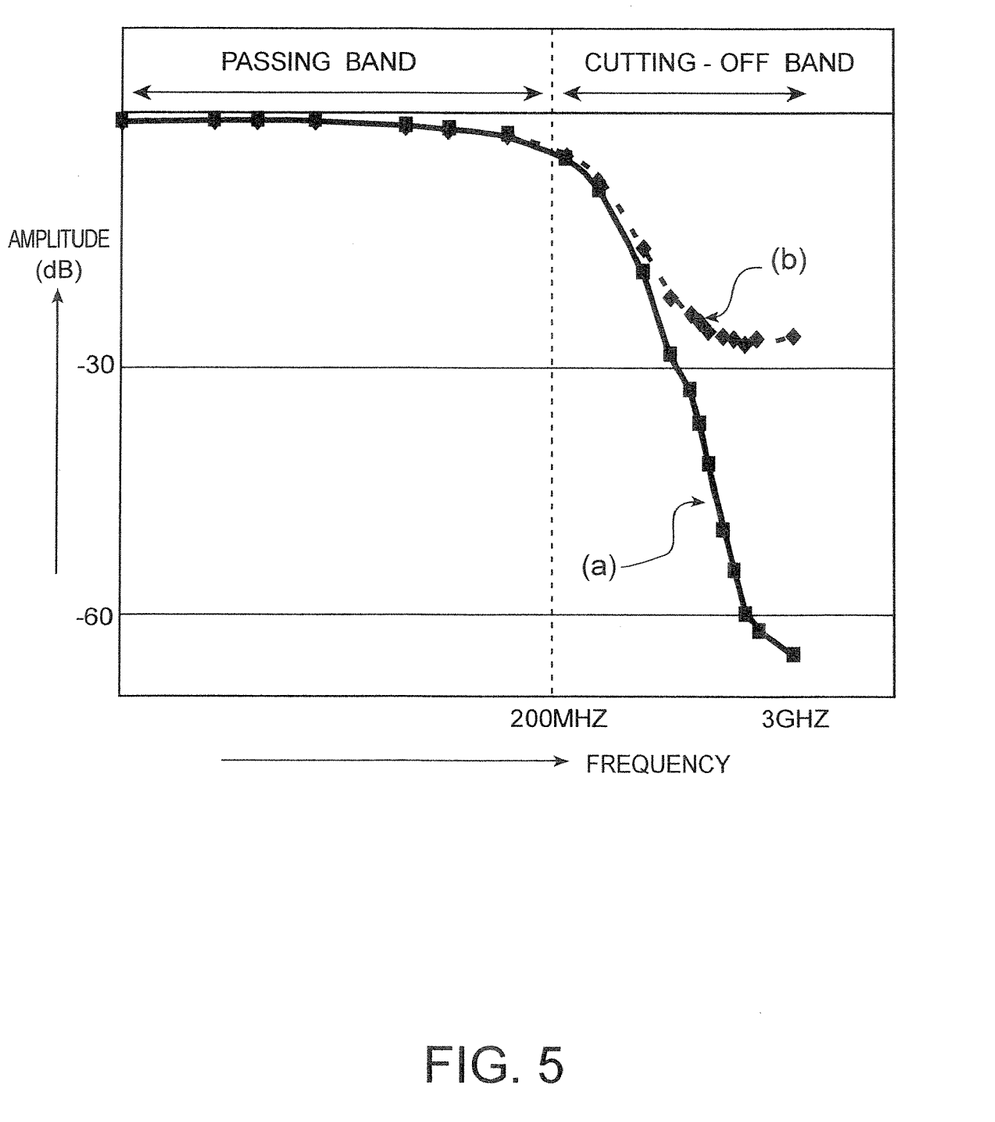
FIG. 5 is a characteristic diagram of the EMI filter shown in FIG. 1.

As shown in FIG. 5, a small resistor component can be used for the resistor component in the prior art RC type LPF. As a result, its insertion loss can be small at a passing band (low frequency region) but its amplitudes capable of cutting-off cannot be made large on the negative side in a cutting-off band (high frequency region). In other words, its signal cutting-off capability is low. Further, since the resistor component is small in value and a large electric current flows through the resistor component when an external high voltage surge is applied to the terminals, ESD endurance cannot be sustained.

On the other hand, similarly to the prior art filter, a small resistor component can be used for polycrystalline silicon resistor component Rp of an RC type LPF in the embodiment of the present invention. Its insertion loss can be also small at a passing band (low frequency region) as in the prior art LPF. Since ring resistor components R11 and R12 are provided on both sides of polycrystalline silicon resistor component Rp of an RC type LPF, when an external high voltage surge of an ESD pulse or a high frequency signal is applied to input terminal Vin, a large current is generated to flow through the resistor component to output terminal Vout and currents are electro-magnetically induced in ring resistor components R11 and R12 provided in parallel with polycrystalline silicon resistor component Rp. Thus, impedances of polycrystalline silicon resistor component Rp in a high frequency region can be large in values and an amplitude as a cutting-off capability can be made large on the negative side in a cutting-off band (on a high frequency side). In other words, its signal cutting-off capability is greater than the prior art RC type LPF. Further, since an impedance of resistor component R1 is large in value and small currents flow through diodes D1 and D2 and resistor component R1 when an external high voltage surge is applied to the terminals, ESD endurance can be sustained.

Further, when resistor component R1 is large in value to improve ESD endurance of EMI filter 20 and a cutting-off capability in a cutting-off band as well, insertion loss in a passing band becomes deteriorated and does not satisfy prescribed technical specifications.

As described above, the EMI filter of the first embodiment is provided with resistor component R1 composed of polycrystalline silicon resistor component Rp and ring resistor components R11 and R12, and diodes D1 and D2 that function as protective diodes at the occurrence of ESD and as capacitors of the EMI filter in its ordinary use. Polycrystalline silicon resistor component Rp is connected between cathode electrode 8 of diode D1 at its one terminal and cathode electrode 8 of diode D2 at its other terminal to function as a resistor component of the EMI filter. Ring resistor components R11 and R12 are provided in parallel with their respective sides of polycrystalline silicon resistor component Rp. When an external high voltage surge of an ESD pulse or a high frequency signal is applied to input terminal Vin, magnetic fields are generated around polycrystalline silicon resistor component Rp to induce electric currents in ring resistor components R11 and R12.

Thus, when a low frequency signal is applied to input terminal Vin, an impedance of polycrystalline silicon resistor component Rp can be made small. Further, when a high frequency signal is applied to input terminal Vin, however, the impedance of polycrystalline silicon resistor component Rp can be made large in value.

Therefore, when a signal (passing band signal) ranging from a DC to a prescribed frequency is applied to input terminal Vin, insertion loss of the EMI filter can be made small. On the other hand, when a high frequency signal (cutting-off band signal) with more than a prescribed frequency is applied to input terminal Vin, its amplitude can be made large on the negative side so that the high frequency signal can be cut off more effectively than the prior art EMI filter. Further, an electric current flowing through polycrystalline silicon resistor component Rp can be suppressed at the occurrence of ESD, so that ESD endurance can be sustained.

Ring resistor components R11 and R12 can be circular, racetrack or elliptical in shape. Since ring resistor components R11 and R12 electro-magnetically induce an electric current when a prescribed high frequency input signal is applied to input terminal Vin as set forth above, ring resistor components R11 and R12 can be replaced by a single ring resistor component performing their equivalent function. A polycide resistor component other than polycrystalline silicon resistor component Rp, a cermet resistor component or a metallic film resistor component can be used in place of N+ polycrystalline film 6.

Second Embodiment

Figure 6:
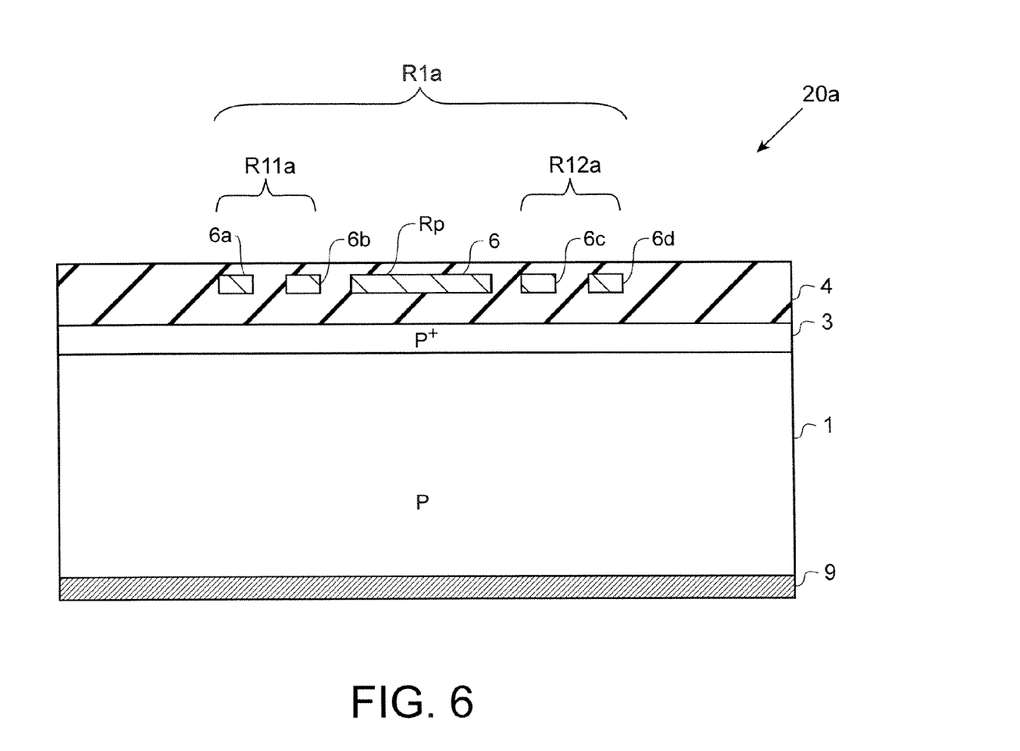
FIG. 6 is a sectional view of an EMI filter in accordance with the second embodiment of the present invention.

An EMI filter of a second embodiment of the present invention will be described with reference to the attached drawings below. FIG. 6 is a sectional view of the EMI filter. In this embodiment, ring resistor components are formed on a field.

Same or similar reference numerals or symbols of the first embodiment are used for its same or similar components in the second embodiment. Thus, components in the second embodiment that are different from those in the first embodiment will be only explained next, not the same or similar components.

As shown in FIG. 6, N+ polycrystalline silicon films 6a, 6b, 6c and 6d and polycrystalline silicon resistor components Rp are selectively formed on P+ inverse prevention layer 3 through insulating layer 4 in EMI filter 20a. Resistor component R1a is composed of ring resistor components R11a and R12a. N+ polycrystalline silicon films 6a and 6b constitute ring resistor component R11a while N+ polycrystalline silicon films 6c and 6d constitute ring resistor component R12a. Ring resistor components R11a and R12a are loops in shape and are provided opposite in parallel with polycrystalline resistor component Rp as in the first embodiment. Although EMI filter 20a includes R1a and diodes D1 and D2, descriptions of diodes D1 and D2 are omitted here.

As described above, EMI filter 20a of the second embodiment is provided with resistor component R1a and diodes D1 and D2. Resistor component R1a is composed of polycrystalline silicon resistor component Rp and ring resistor components R11a and R12a made from N+ polycrystalline silicon films. Diodes D1 and D2 function as protective diodes and capacitors of the EMI filter at the occurrence of ESD and its ordinary use, respectively. Polycrystalline silicon resistor component Rp is connected between cathode electrode 8 of diode D1 at its one terminal and cathode electrode 8 of diode D2 at its other terminal to function as a resistor component of the EMI filter. Ring resistor components R11a and R12a are provided in parallel with their respective sides of polycrystalline silicon resistor component Rp. When an external high voltage surge of an ESD pulse or a high frequency signal is applied to input terminal Vin, a magnetic field is generated around polycrystalline silicon resistor component Rp to induce electric currents in ring resistor components R11a and R12a.

Thus, when a low frequency signal is applied to input terminal Vin, an impedance of polycrystalline silicon resistor component Rp can be made small. Further, when a high frequency signal is applied to input terminal Vin, however, the impedance of polycrystalline silicon resistor component Rp can be made large.

Therefore, when a signal (passing band signal) ranging from a DC to a prescribed frequency is applied to input terminal Vin, insertion loss of the EMI filter can be made small. On the other hand, when a high frequency signal (cutting-off band signal) with more than a prescribed frequency is applied to input terminal Vin, its amplitude can be made large on the negative side so that the high frequency signal can be cut off more effectively than the prior art EMI filter. Further, an electric current flowing through polycrystalline silicon resistor component Rp can be suppressed at the occurrence of ESD, so that ESD endurance can be sustained. Further, since ring resistor components R11a and R12a are made from N+ polycrystalline silicon films, it is much easier to make them high resistances than coupling resistor components R11 and R12 made from diffusion resistor components in the first embodiment. Thus, pattern widths can be made finer to occupy less in area than those in the first embodiment.

In the second embodiment, N+ polycrystalline silicon film 6 for ring resistor components R11a and R12a can be replaced by a polycide resistor component, a cermet resistor component or a metallic film resistor component.

Third Embodiment

Figure 7:
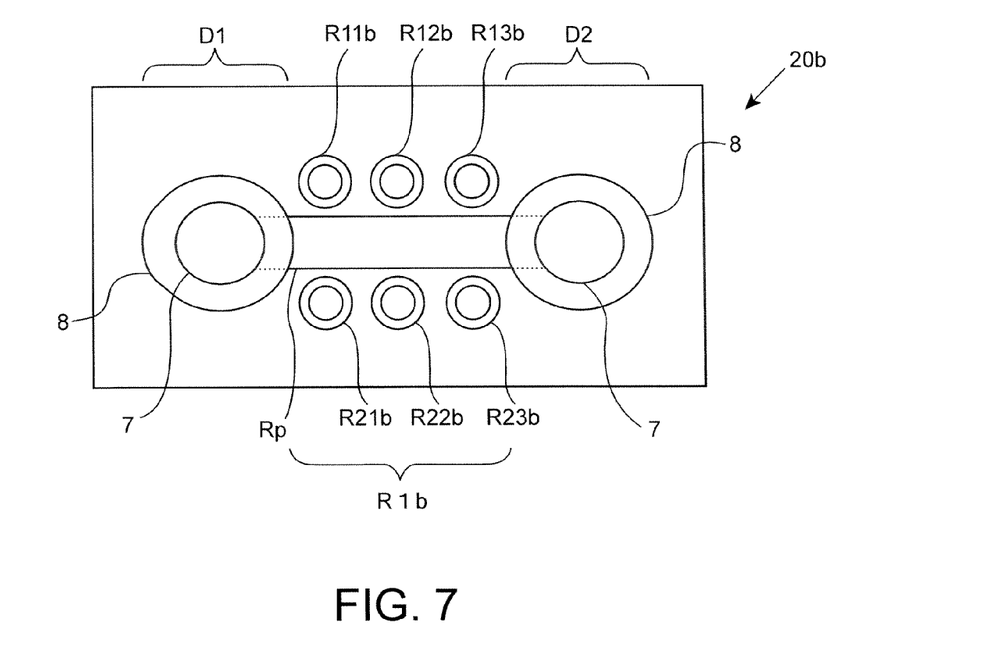
FIG. 7 is a schematic plan view of an EMI filter in accordance with the third embodiment of the present invention.

An EMI filter with ESD diodes of a third embodiment of the present invention will be described below with reference to the attached drawings. FIG. 7 is a plan view of the EMI filter. In this embodiment, the number of ring resistor components is changed.

Same or similar reference numerals or symbols of the first embodiment are used for its same or similar components in the third embodiment. Thus, components in the third embodiment that are different from those in the first embodiment will be only explained next, not the same or similar components.

As shown in FIG. 7, EMI filter 20b is provided with diodes D1 and D2, polycrystalline silicon resistor components Rp and ring resistor components R11b-R13b and R21b-R23b. Polycrystalline silicon resistor components Rp and ring resistor components R11b-R13b and R21b-R23b collectively constitute resistor component R1b.

Ring resistor components R11b-R13b are loops in shape and are provided opposite in parallel with one side of polycrystalline silicon resistor component Rp at a prescribed distance. Ring resistor components R11b-R13b are electro-magnetically coupled with polycrystalline silicon resistor component Rp. Likewise, Ring resistor components R21b-R23b are loops in shape and are provided opposite in parallel with the other side of polycrystalline silicon resistor component Rp at a prescribed distance. Further, ring resistor components R21b-R23b are electro-magnetically coupled with polycrystalline silicon resistor component Rp. It is desirable to make the distance between ring resistor components R11b-R13b and polycrystalline silicon resistor component Rp equal to that between ring resistor components R21b-R23b and polycrystalline silicon resistor component Rp.

As described above, EMI filter 20b of the third embodiment is provided with resistor component R1b and diodes D1 and D2. Resistor component R1b is composed of polycrystalline silicon resistor component Rp and ring resistor components R11b-R13b and R21b-R23b. Diodes D1 and D2 are Zener diodes that function as protective diodes and capacitors of the EMI filter at the occurrence of ESD and its ordinary use, respectively. Polycrystalline silicon resistor component Rp is connected between cathode electrode 8 of diode D1 at its one terminal and cathode electrode 8 of diode D2 at its other terminal to function as a resistor component of the EMI filter. Ring resistor components R11b-R13b and ring resistor components R21b-R23b are provided opposite in parallel with both sides of polycrystalline silicon resistor component Rp at the prescribed distance, respectively. When an external high voltage surge of an ESD pulse or a high frequency signal is applied to input terminal Vin, a magnetic field is generated around polycrystalline silicon resistor component Rp to induce currents in ring resistor components R11b-R13b and ring resistor components R21b-R23b, respectively.

Thus, when a low frequency signal is applied to input terminal Vin, an impedance of polycrystalline silicon resistor component Rp can be made small. Further, when an external high voltage surge of an ESD pulse or a high frequency signal is applied to input terminal Vin, however, the impedance of polycrystalline silicon resistor component Rp can be made large.

Therefore, when a signal (passing band signal) ranging from a DC to a prescribed frequency is applied to input terminal Vin, insertion loss of the EMI filter can be made small. On the other hand, when a high frequency signal (cutting-off band signal) with more than a prescribed frequency is applied to input terminal Vin, its amplitude can be made large on the negative side so that the high frequency signal can be cut off more effectively than the prior art EMI filter. Further, an electric current flowing through polycrystalline silicon resistor component Rp can be suppressed at the occurrence of ESD, so that ESD endurance can be sustained. Further, since ring resistor components R11a and R12a are made from N+ polycrystalline silicon films, it is much easier to make them high resistances than coupling resistor components R11 and R12 made from diffusion resistor components in the first embodiment. Thus, pattern widths can be made finer to occupy less in area than those in the first embodiment.

In the third embodiment, although the number of the ring resistor components are three on either side of polycrystalline silicon resistor component Rp, it can be two or four or more.

Fourth Embodiment

Figure 8:
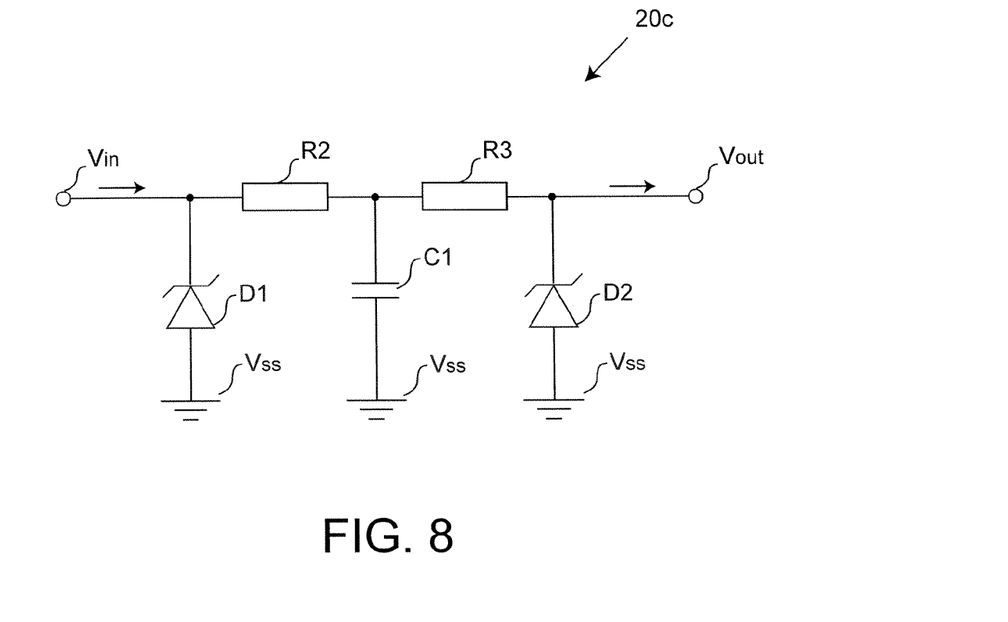
FIG. 8 is a circuit diagram of an EMI filter in accordance with the fourth embodiment of the present invention.

An EMI filter with ESD protective diodes of a fourth embodiment of the present invention will be described with reference to the attached drawings below. FIG. 8 is a circuit diagram of the EMI filter. In this embodiment, the number of resistor components are changed while a capacitor is added.

Same or similar reference numerals or symbols of the first embodiment are used for its same or similar components in the third embodiment. Thus, components in the third embodiment that are different from those in the first embodiment will be only explained next, not the same or similar components.

As shown in FIG. 8, EMI filter 20c is provided with diodes D1 and D2, resistor components R2 and R3 and capacitor C1.

Resistor component R2 is connected between a cathode electrode of diode D1 and a common node of one terminal of resistor component R3 and capacitor C1. Resistor component R2 is composed of a polycrystalline silicon resistor component as a main resistor component and ring resistor components provided in parallel with both sides of the polycrystalline silicon resistor component as in the first embodiment. Capacitor C1 is connected to a reference potential or low voltage power source at its other terminal. Resistor component R3 is also composed of a polycrystalline silicon resistor component as an additional main resistor component and ring resistor components provided in parallel with both sides of the polycrystalline silicon resistor component as in the first embodiment. EMI filter 20c of the fourth embodiment functions as an RC type LPF (low pass filter) provided with capacitor components of diodes D1 and D2, capacitor C1 and resistor components R2 and R3 in its ordinary operation. An external high voltage surge can be dropped through diodes D1 and D2 at the occurrence of ESD.

As described above, EMI filter 20c of the fourth embodiment is provided with diodes D1 and D2, resistor components R2 and R3 composed of the polycrystalline silicon resistor components and the ring resistor components provided in parallel with both sides of the polycrystalline resistor components and capacitor C1. When an external high voltage surge of an ESD pulse signal or a high frequency signal is applied to input terminal Vin, a magnetic field is generated around the polycrystalline silicon resistor component provided in resistor components R2 and R3 to electro-magnetically induce electric currents in the ring resistor components of resistor components R2 and R3, respectively.

Thus, when a low frequency signal is applied to input terminal Vin, an impedance of the polycrystalline silicon resistor components is made small. Further, when an external high voltage surge of an ESD pulse signal or a high frequency signal, however, is applied to input terminal Vin, the impedance of the polycrystalline silicon resistor component can be made large.

Therefore, electric currents flowing through the polycrystalline silicon resistor components can be suppressed at the occurrence of ESD, so that ESD endurance can be sustained. Further, when a signal (passing band signal) ranging from a DC to a prescribed frequency is applied to input terminal Vin, insertion loss of EMI filter 20c including capacitor C1, resistor components R2 and R3 can be made small in its ordinary operation. On the other hand, when a high frequency signal (cutting-off band signal) with more than a prescribed frequency is applied to input terminal Vin, its amplitude can be made large on the negative side, so that the high frequency signal can be cut off more effectively than the prior art EMI filter.

Figure 9:
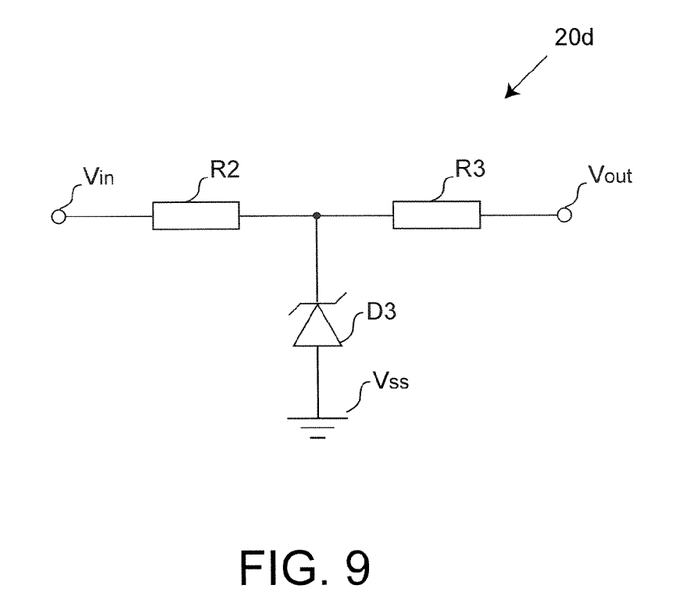
FIG. 9 is a circuit diagram of an EMI filter in accordance with the fifth embodiment of the present invention.

The present invention is carried out by various other embodiments. For example, as shown in FIG. 9, EMI filter 20d is provided with serially connected resistor components R2 and R3 between input and output terminals Vin and Vout and Zener diode D3, the cathode and anode electrodes of which are connected between a connecting node of resistor components R2 and R3 and reference potential Vss. Resistor components R2 and R3 are formed in the same structure and process as shown in FIGS. 4 and 6. Since resistor components R2 and R3 include ring resistor components while Zener diode D3 functions as a capacitor, EMI filter 20d can be designed to exhibit substantially the same characteristics as EMI filter 20, 20a, 20b or 20c.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. An EMI filter comprising:
an input terminal to which a first input signal ranging from a DC to a prescribed frequency and a second input signal ranging in not less than the prescribed frequency are supplied;
an output terminal;
a main resistor component connected between the input terminal and the output terminal;
a first coupling resistor component provided along the main resistor component at a prescribed distance to electro-magnetically induce an electric current when the main resistor component transmits the first input signal to the output terminal; and
a first diode having cathode and anode electrodes connected to the input terminal and a reference potential, respectively.

2. An EMI filter according to claim 1, further comprising a second diode having cathode and anode electrodes connected to the output terminal and a reference potential, respectively.

3. An EMI filter according to claim 1, wherein the first coupling resistor component is made from a first conductive type semiconductor formed in a second conductive type semiconductor layer and the main resistor component is made from polycrystalline silicon formed in an isolating layer provided on the second conductive type semiconductor layer.

4. An EMI filter according to claim 1, wherein the main resistor component and the coupling resistor component are made from polycrystalline silicon formed in an isolating layer provided on a semiconductor substrate.

5. An EMI filter according to claim 1, further comprising a second coupling resistor component provided opposite to the first coupling resistor component with respect to the main resistor component at a prescribed distance to induce an electric current when the main resistor component transmits the first input signal to the output terminal.

6. An EMI filter according to claim 1, wherein the first coupling resistor component is rectangular, circular, racetrack, or elliptical in shape.

7. An EMI filter according to claim 2, wherein the first and second diodes are Zener diodes.

8. An EMI filter comprising:
an input terminal to which a first input signal ranging from a DC to a prescribed frequency and a second input signal ranging in not less than the prescribed frequency are supplied;
an output terminal;
a first main resistor component connected to the input terminal;
a second main resistor component serially connected to the first main resistor component with respect to the input and output terminals;
a first coupling resistor component provided on one side of the first main resistor component at a prescribed distance to electro-magnetically induce an electric current when the first main resistor component transmits the first input signal to the output terminal;
a second coupling resistor component provided on another side of the first main resistor component at a prescribed distance to electro-magnetically induce an electric current when the first main resistor component transmits the first input signal to the output terminal;
a third coupling resistor component provided on one side of the second main resistor component at a prescribed distance to electro-magnetically induce an electric current when the second main resistor component transmits the first input signal to the output terminal;
a fourth coupling resistor component provided on another side of the second main resistor component at a prescribed distance to electro-magnetically induce an electric current when the second main resistor component transmits the first input signal to the output terminal;
a first diode having cathode and anode electrodes connected to the input terminal and a reference potential, respectively;
a second diode having cathode and anode electrodes connected to the output terminal and the reference potential, respectively; and
a capacitor connected between a connecting node of the first and second main resistor components and the reference potential.

9. An EMI filter according to claim 8, wherein the first through fourth coupling resistor components are made from a first conductive type semiconductor layer formed in a second conductive type semiconductor layer and the first and second main resistor components are made from polycrystalline silicon formed in an isolating layer provided on the second conductive type semiconductor layer.

10. An EMI filter according to claim 8, wherein the first and second main resistor components and the first through fourth coupling resistor components are made from polycrystalline silicon formed in an isolating layer provided on a semiconductor substrate.

11. An EMI filter according to claim 8, wherein the first through fourth coupling resistor components are rectangular, circular, racetrack, or elliptical in shape.

12. An EMI filter according to claim 8, wherein the first and second diodes are Zener diodes.

13. An EMI filter comprising:
an input terminal to which a first input signal ranging from a DC to a prescribed frequency and a second input signal ranging in not less than the prescribed frequency are supplied;
an output terminal;
a first main resistor component connected to the input terminal;
a second main resistor component serially connected to the first main resistor component with respect to the input and output terminals;
a first coupling resistor component provided on one side of the first main resistor component at a prescribed distance to electro-magnetically induce an electric current when the first main resistor component transmits the first input signal to the output terminal;
a second coupling resistor component provided on another side of the first main resistor component at a prescribed distance to electro-magnetically induce an electric current when the first main resistor component transmits the first input signal to the output terminal;
a third coupling resistor component provided on one side of the second main resistor component at a prescribed distance to electro-magnetically induce an electric current when the second main resistor component transmits the first input signal to the output terminal;
a fourth coupling resistor component provided on another side of the second main resistor component at a prescribed distance to electro-magnetically induce an electric current when the second main resistor component transmits the first input signal to the output terminal; and a diode connected between a connecting node of the first and second main resistor components and the reference potential.

14. An EMI filter according to claim 13, wherein the first through fourth coupling resistor components are made from a first conductive type semiconductor layer formed in a second conductive type semiconductor layer and the first and second main resistor components are made from polycrystalline silicon formed in an isolating layer provided on the second conductive type semiconductor layer.

15. An EMI filter according to claim 13, wherein the first and second main resistor components and the first through fourth coupling resistor components are made from polycrystalline silicon formed in an isolating layer provided on a semiconductor substrate.

16. An EMI filter according to claim 13, wherein the first through fourth coupling resistor component are rectangular, circular, racetrack, or elliptical in shape.

17. An EMI filter according to claim 13, wherein the diode is a Zener diode.

* * * * *